United States Patent
Ho et al.

(10) Patent No.: US 11,584,995 B2
(45) Date of Patent: Feb. 21, 2023

(54) CLUSTERED REACTION SYSTEM

(71) Applicant: National Tsing Hua University, Hsinchu (TW)

(72) Inventors: Shih-Jung Ho, Tainan (TW); Hsueh-Shih Chen, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 380 days.

(21) Appl. No.: 17/077,890

(22) Filed: Oct. 22, 2020

(65) Prior Publication Data
US 2021/0363641 A1 Nov. 25, 2021

(30) Foreign Application Priority Data
May 19, 2020 (TW) ................. 109116497

(51) Int. Cl.
| | |
|---|---|
| *B01J 4/00* | (2006.01) |
| *B01J 19/00* | (2006.01) |
| *B01J 19/18* | (2006.01) |
| *B01J 19/26* | (2006.01) |
| *C23C 16/52* | (2006.01) |
| *H01L 21/67* | (2006.01) |

(52) U.S. Cl.
CPC ............ *C23C 16/52* (2013.01); *B01J 19/26* (2013.01); *H01L 21/67155* (2013.01); *B01J 4/002* (2013.01); *B01J 19/0013* (2013.01); *B01J 2219/0002* (2013.01); *B01J 2219/0006* (2013.01); *B01J 2219/0009* (2013.01); *B01J 2219/00063* (2013.01); *B01J 2219/00087* (2013.01); *B01J 2219/00164* (2013.01)

(58) Field of Classification Search
CPC ..... B01J 4/00; B01J 4/001; B01J 4/002; B01J 19/00; B01J 19/0006; B01J 19/0013; B01J 19/0053; B01J 19/0066; B01J 19/18; B01J 19/26; B01J 2219/00; B01J 2219/00002; B01J 2219/00018; B01J 2219/0002; B01J 2219/00049; B01J 2219/00051; B01J 2219/00054; B01J 2219/00056; B01J 2219/00058; B01J 2219/0006; B01J 2219/00063; B01J 2219/00074; B01J 2219/00087; B01J 2219/0009; B01J 2219/00164; C23C 16/00; C23C 16/44; C23C 16/52; H01L 21/00; H01L 21/67; H01L 21/67005; H01L 21/67011; H01L 21/67155
See application file for complete search history.

(56) References Cited

U.S. PATENT DOCUMENTS 10,010,850 B2 * 7/2018 Chen .................... B01J 19/0066

* cited by examiner

*Primary Examiner* — Natasha E Young
(74) *Attorney, Agent, or Firm* — Hamre, Schumann, Mueller & Larson, P.C.

(57) ABSTRACT

A clustered reaction system includes multiple reaction devices, a cooling device and a gas supply device. Each of the reaction devices includes a reaction tank unit defining a reaction space, multiple through holes extending through the reaction tank unit, a heat exchange module including a heat exchange passage surrounding the reaction tank, and an injection module extending through one of the through hole. The cooling device is connected to the heat exchange passages of the reaction devices for supplying a coolant into the heat exchange passages. The gas supply device is communicated fluidly with one of the through holes of each of the reaction devices for supplying a gas to the reaction devices.

11 Claims, 4 Drawing Sheets

CLUSTERED REACTION SYSTEM

CROSS-REFERENCE TO RELATED APPLICATION

This application claims priority of Taiwanese Patent Application No. 109116497, filed on May 19, 2020.

FIELD

The disclosure relates to a reaction system, and more particularly to a clustered reaction system.

BACKGROUND

Quantum dots have been widely researched and applied in various fields, such as optoelectronics, electronics, optics, etc., due to their unique dimensional properties. However, the synthesis of quantum dots is easily affected by different factors, such as impurities, temperature, concentration, etc. In commercial application, efficiency of quantum dot synthesis is another important factor. Therefore, it is desirable in the art to develop a system that can efficiently produce high quality quantum dots.

SUMMARY

According to an aspect of this disclosure, a clustered reaction system includes a plurality of reaction devices, a cooling device and a gas supply device.

The reaction devices are spaced apart from each other. Each of the reaction devices includes a reaction tank unit that defines a reaction space adapted for receiving reaction materials, a plurality of through holes that extend through the reaction tank unit and that are spatially communicated with the reaction space, a heat exchange module that includes a heat exchange passage surrounding the reaction tank unit and having an inlet and an outlet, and an injection module that extends through one of the through holes and that is adapted for providing at least one of the reaction materials into the reaction space.

The cooling device is adapted for supplying a coolant into the heat exchange passage of each of the reaction devices, and includes a liquid supply main channel and a plurality of liquid supply side channels. Each of the liquid supply side channels includes a liquid inlet tube, and a liquid outlet tube that are communicated fluidly with the liquid supply main channel and that are respectively and fluidly communicated with the inlet and the outlet of the heat exchange passage of a respective one of the reaction devices. The gas supply device is adapted for supplying a gas to the reaction devices, and includes a gas supply main channel and a plurality of gas supply side channels. Each of the gas supply side channels is communicated fluidly between the gas supply main channel and one of the through holes of a respective one of the reaction devices.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
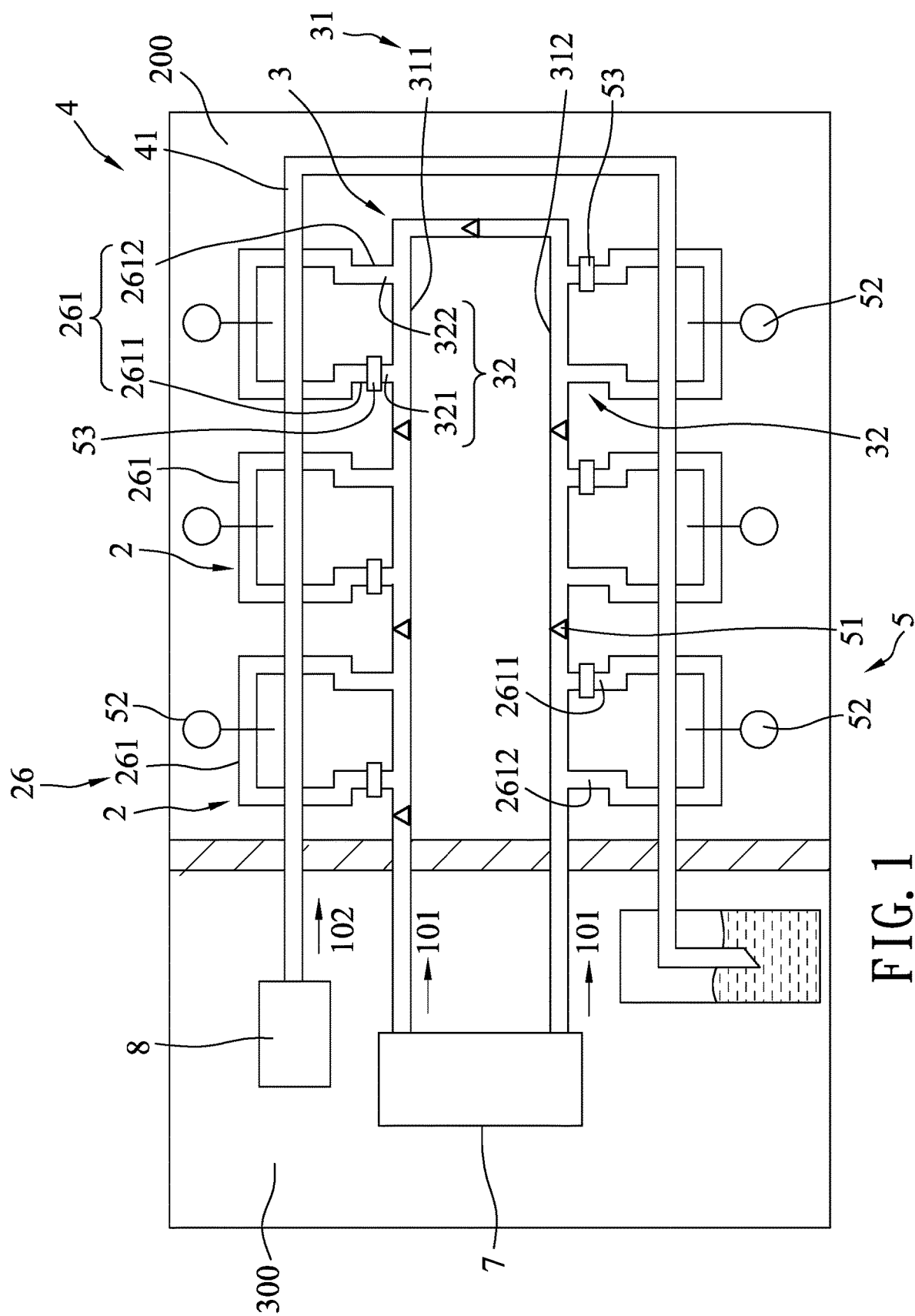
FIG. 1 is a schematic top view showing an embodiment of a clustered reaction system according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
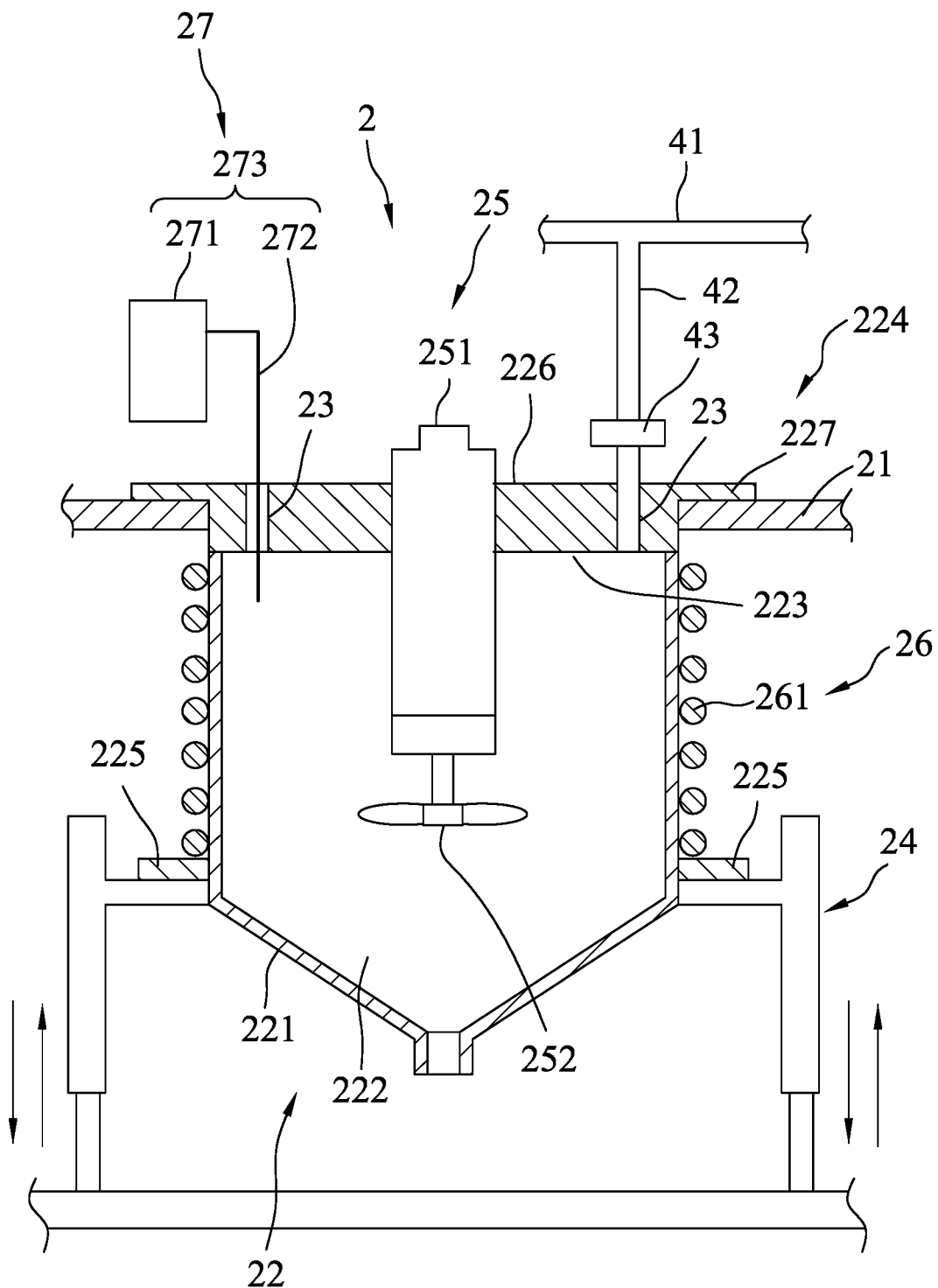
FIG. 2 is a partly sectional view, showing one of reaction devices of the embodiment.
Figure 3:
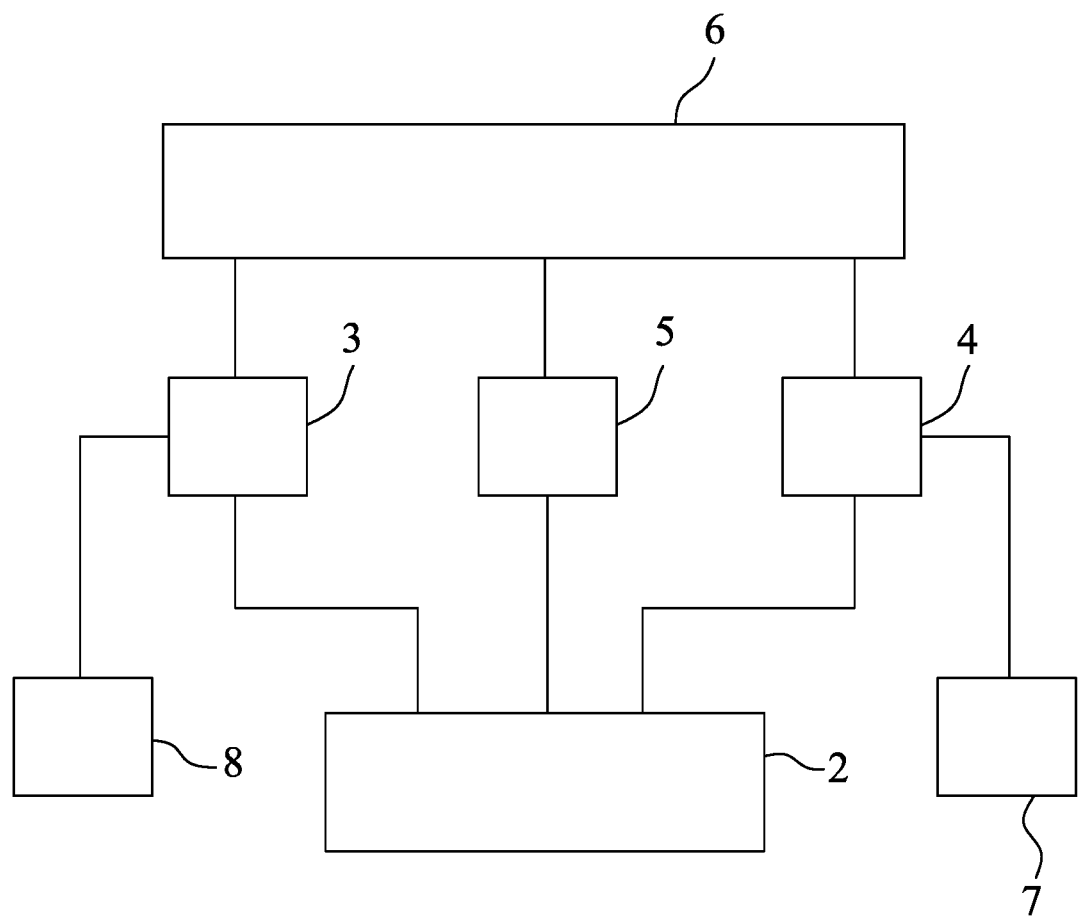
FIGS. 3 and 4 are block diagrams showing communication of components of the embodiment.

Referring to FIGS. 1 to 3, an embodiment of a clustered reaction system according to the present disclosure is installed in an operation region 200 and a control region 300.

The clustered reaction system includes a plurality of reaction devices 2, a cooling device 3, a gas supply device 4, a temperature monitor device 5 and a real-time control device 6 that are installed in the operation region 200. The clustered reaction system further includes a coolant circulating device 7 and a gas supply station 8 that are installed in the control region 300.

The reaction devices 2 are spaced apart from each other. Each of the reaction devices 2 includes a support platform 21, a reaction tank unit 22, a plurality of through holes 23, a lift frame 24, a stirrer module 25, a heat exchange module 26 and an injection module 27.

For each of the reaction devices 2, the reaction tank unit 22 includes a reaction tank body 221 that defines a reaction space 222 adapted for receiving reaction materials and that has an opening 223 spatially communicated with the reaction space 222, a cover 224 that is connected to the support platform 21 for covering the opening 223 and that is formed with the through holes 23, and two support blocks 225 that are respectively connected to two opposite sides of the reaction tank body 221 and that are supported by the lift frame 24. The cover 224 includes a sealing portion 226 that covers the opening 223 when the reaction tank body 221 is in contact with the cover 224, and a support portion 227 that surrounds the sealing portion 226 and that is supported by the support platform 21. The through holes 23 extend through the cover 224, and are spatially communicated with the reaction space 222. In this embodiment, the lift frame 24 is located below the support platform 21, and the support blocks 225 are supported by upwardly facing surfaces of the lift frame 24, which is operable to lift the support blocks 225 to bring the reaction tank body 221 to come into contact with the cover 224 to cover the opening 223, and is operable to lower the support blocks 225 to bring the reaction tank body 221 away from the cover 224 to uncover the opening 223. The stirrer module 25 includes a shaft 251 that extends through the cover 224 into the reaction space 222, and at least one blade 252 that is connected to an end of the shaft 251 and that is disposed rotatably in the reaction space 222. It should be noted that the components of the stirrer module 25 and the number of the blade 252 can be adjusted according to practical requirements. The heat exchange module 26 includes a heat exchange passage 261 that surrounds the reaction tank body 221 of the reaction tank unit 22 for a coolant 101 to pass through the heat exchange passage 261, and that has an inlet 2611 and an outlet 2612. The injection module 27 extends through one of the through holes 23 and is adapted for providing at least one of the reaction materials into the reaction space 222. The injection module 27 includes an injection unit 273 that includes a liquid tank 271 and an injection nozzle 272. The injection nozzle 272 is connected to the liquid tank 271, extends through one of the through holes 23, is not in contact with the reaction materials, and is adapted for injecting one of the reaction materials into the reaction space 222. The injection module 27 may utilize a solenoid valve (not shown) to control the injection nozzle 272 to inject the reaction material with a predetermined pressure from the liquid tank 271 into the reaction space 222. In certain embodiments, the injection module 27 can include a plurality of the injection units 273 for injecting different reaction materials into the reaction space 222.

The cooling device 3 is adapted for supplying the coolant 101 into the heat exchange passages 261 of the reaction devices 2. The cooling device 3 includes a liquid supply main channel 31 and a plurality of liquid supply side channels 32. Each of the liquid supply side channels 32 includes a liquid inlet tube 321 and a liquid outlet tube 322 that are communicated fluidly with the liquid supply main channel 31 and that are respectively and fluidly communicated with the inlet 2611 and the outlet 2612 of the heat exchange passage 261 of a respective one of the reaction devices 2. In this embodiment, the liquid supply main channel 31 is U-shaped, is disposed horizontally, and includes a first tube 311 and a second tube 312 that are parallel to each other. The reaction devices 2 are divided into two groups that are respectively connected to the first tube 311 and the second tube 312. In this embodiment, the system includes six reaction devices 2, three of which are connected to the first tube 311 and the other three of which are connected to the second tube 312. The number and arrangement of the reaction devices 2 can be changed according to practical requirements. In certain embodiments, the liquid supply main channel 31 may extend in a straight line without being U-shaped. It should be noted that the shape and arrangement of the liquid supply main channel 31 can be changed according to practical requirements. In certain embodiments, the diameter of the liquid supply main channel 31 may be two to ten times of that of each of the liquid supply side channels 32. The ratio may be changed according to practical requirements. The coolant 101 exiting the heat exchange passage 261 can be rapidly cooled by the coolant 101 in the liquid supply main channel 31 to achieve effective temperature control of the reaction devices 2.

In certain embodiments, a minimum distance between adjacent two of the reaction devices 2 ranges from 30 cm to 500 cm, allowing the coolant 101 exiting the heat exchange passage 261 of one of the reaction devices 2 to be cooled before entering the heat exchange passage 261 of the next reaction device 2.

The gas supply device 4 is adapted for supplying a gas 102 to the reaction devices 2, and includes a gas supply main channel 41, a plurality of gas supply side channels 42 (only one is shown in FIG. 2), and a flow control valve 43. Each of the gas supply side channels 42 is communicated fluidly between the gas supply main channel 41 and one of the through holes 23 of a respective one of the reaction devices 2. The flow control valve 43 is operable to control the amount of the gas 102 flowing into the reaction space 222. It should be noted that, in certain embodiments, the gas supply device 4 can includes a plurality of the gas supply main channels 41 supplying different types of gas to the reaction devices 2.

Figure 4:
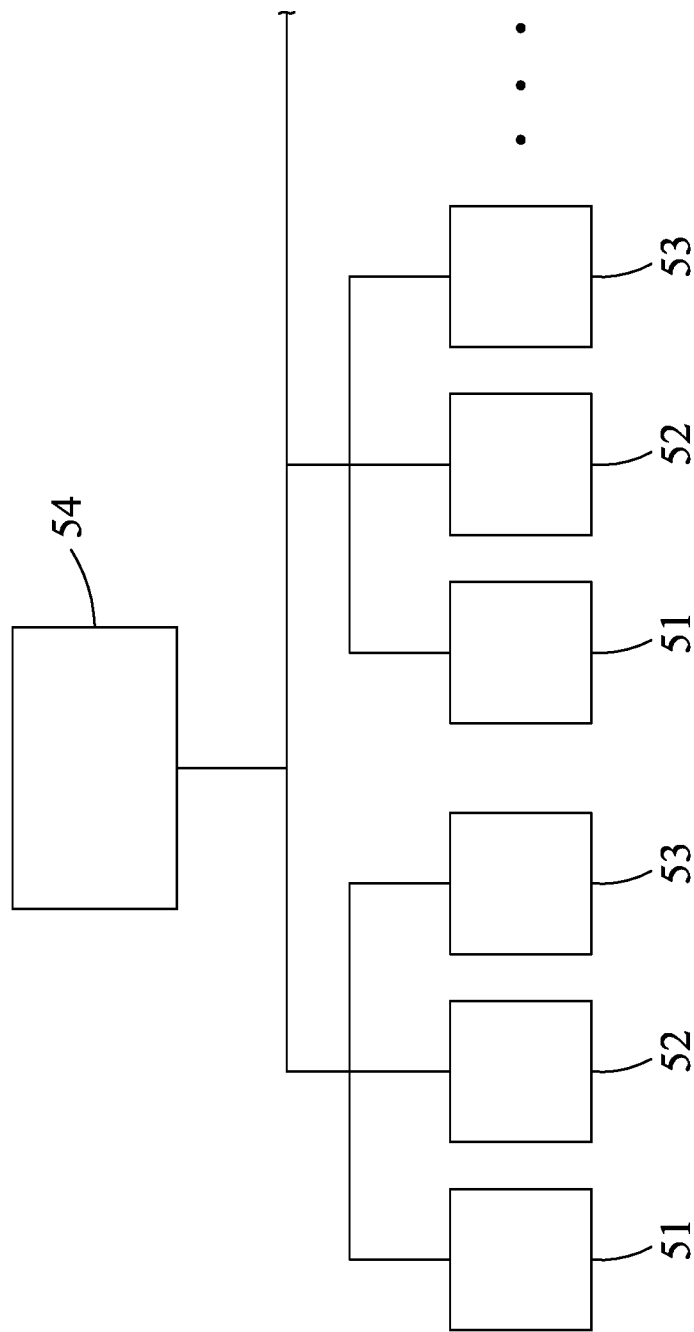

Referring further to FIG. 4, the temperature monitor device 5 includes a plurality of first temperature monitors 51, a plurality of second temperature monitors 52, a plurality of control valves 53 and a control unit 54. Each of the first temperature monitors 51 is disposed between adjacent two of the reaction devices 2 and is adapted for measuring temperature of the coolant 101 between the adjacent reaction devices 2. Each of the second temperature monitors 52 corresponds to a respective one of the reaction devices 2 (e.g., is disposed on the respective one of the reaction devices 2), and is adapted for measuring temperature of the reaction materials received in the reaction space 222 of the respective one of the reaction devices 2. Each of the control valves 53 is connected to the inlet 2611 of the heat exchange passage 261 of a respective one of the reaction devices 2, and is operable to control the amount of the coolant 101 entering the inlet 2611 of the heat exchange passage 261 of the respective one of the reaction devices 2 based on measurements of one of the first temperature monitors 51 and one of the second temperature monitors 52. The control unit 54 is in signal communication with the first temperature monitors 51, the second temperature monitors 52 and the control valves 53, and is operable to control operation of each of the control valves 53 based on the measurements. Specifically, the control unit 54 receives the measurement results of one of the first temperature monitors 51 and the second temperature monitors 52 disposed immediately downstream of the first temperature monitor 51, and determines the amount of the coolant 101 entering the inlet 2611 of the heat exchange passage 261 of one of the reaction devices 2 by controlling one of the control valves 53, thereby achieving precise control of temperature of the reaction devices 2.

The real-time control device 6 is in signal communication with the reaction devices 2 (represented by a single block in FIG. 3), the cooling device 3, the gas supply device 4, and the temperature monitor device for monitoring parameters of and independently controlling operations of the reaction devices 2, the cooling device 3, the gas supply device 4 and the temperature monitor device 5, such as lifting or lowering of the lift frames 24 of the reaction devices 2, stirring speed of the stirring modules 25 of the reaction devices 2, the amount or pressure of the injection action of the injection modules 27 of the reaction devices 2, the amount of the coolant 101 flowing from the coolant circulating device 7, and the amount of the gas 102 of the gas supply station 8.

It should be noted that the reaction devices 2 can be divided into different groups, and the real-time control device 6 can include different units for monitoring and controlling the groups for different reactions.

The coolant circulating device 7 and the gas supplying station 8 are installed in the control region 300. The coolant circulating device 7 is communicated fluidly with the liquid supply main channel 31 for cooling the coolant 101 and supplying the coolant 101 to the liquid supply main channel 31. The gas supply station 8 is communicated fluidly with the gas supply main channel 41 for supplying the gas 102 to the gas supply main channel 41. The gas 102 may be inert gas or reaction gases. In certain embodiments, the gas supplying station 8 may include multiple units for supplying different gases to the supply main channel 41. In situations where there are multiple supply main channels 41, the units of the gas supplying station 8 can be used for respectively supplying a certain gas to the supply main channels 41.

The clustered reaction system of this disclosure utilizes multiple reaction devices 2 for reaction, and utilizes the cooling device 3 and the gas supply device 4 for all of the reaction devices 2 without having to individually provide a cooling device and a gas supply device to each of the reaction devices 2. Therefore, only one staff is needed to monitor the clustered reaction system instead of having to assign multiple personnel to take care of the reaction devices 2. In addition, the temperature monitor device 5 serves to precisely control the temperatures of the reaction devices 2. Therefore, the clustered reaction system of this disclosure can be used for efficiently and precisely making products, such as quantum dots.

In the description above, for the purposes of explanation, numerous specific details have been set forth in order to provide a thorough understanding of the embodiments. It will be apparent, however, to one skilled in the art, that one or more other embodiments maybe practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiment but is intended to cover various arrangements included within the spirit and scope of the broadest interpretation so as to encompass all such modifications and equivalent arrangements.

What is claimed is:

1. A clustered reaction system comprising:
    a plurality of reaction devices that are spaced apart from each other, each of said reaction devices including
        a reaction tank unit that defines a reaction space adapted for receiving reaction materials,
        a plurality of through holes that extend through said reaction tank unit and that are spatially communicated with said reaction space,
        a heat exchange module that includes a heat exchange passage surrounding said reaction tank unit and having an inlet and an outlet, and
        an injection module that extends through one of said through holes and that is adapted for providing at least one of the reaction materials into said reaction space;
    a cooling device that is adapted for supplying a coolant into said heat exchange passage of each of said reaction devices, and that includes a liquid supply main channel and a plurality of liquid supply side channels, each of said liquid supply side channels including a liquid inlet tube and a liquid outlet tube that are communicated fluidly with said liquid supply main channel and that are respectively and fluidly communicated with said inlet and said outlet of said heat exchange passage of a respective one of said reaction devices; and
    a gas supply device that is adapted for supplying a gas to said reaction devices, and that includes a gas supply main channel and a plurality of gas supply side channels, each of said gas supply side channels being communicated fluidly between said gas supply main channel and one of said through holes of a respective one of said reaction devices.

2. The clustered reaction system as claimed in claim 1, further comprising a temperature monitor device that includes:
    a plurality of first temperature monitors, each of said first temperature monitors being adapted for measuring temperature of the coolant between adjacent two of said reaction devices;
    a plurality of second temperature monitors, each of said second temperature monitors being adapted for measuring temperature of the reaction materials received in said reaction space of a respective one of said reaction devices; and
    a plurality of control valves, each of said control valves being connected to said inlet of said heat exchange passage of a respective one of said reaction devices and being operable to control the amount of the coolant entering said inlet of said heat exchange passage of the respective one of said reaction devices based on measurements of one of said first temperature monitors and one of said second temperature monitors.

3. The clustered reaction system as claimed in claim 2, wherein:
    said temperature monitor device further includes a control unit that is in signal communication with said first temperature monitors, said second temperature monitors and said control valves; and
    said control unit is operable to control operation of each of said control valves based on the measurements.

4. The clustered reaction system as claimed in claim 1, wherein:
    said liquid supply main channel is U-shaped, is disposed horizontally, and includes a first tube and a second tube; and
    said reaction devices are divided into two groups that are respectively connected to said first tube and said second tube.

5. The clustered reaction system as claimed in claim 1, wherein a minimum distance between adjacent two of said reaction devices ranges from 30 cm to 500 cm.

6. The clustered reaction system as claimed in claim 1, further comprising:
    a coolant circulating device that is communicated fluidly with said liquid supply main channel for cooling the coolant; and
    a gas supply station that is communicated fluidly with said gas supply main channel for supplying the gas to said gas supply main channel.

7. The clustered reaction system as claimed in claim 1, wherein each of said reaction devices further includes a stirrer module that includes at least one blade disposed rotatably in said reaction space of said reaction device.

8. The clustered reaction system as claimed in claim 1, wherein said injection module of each of said reaction devices includes an injection unit that includes a liquid tank and an injection nozzle which is connected to said liquid tank, which extends through said one of said through holes, which is not in contact with the reaction materials, and which is adapted for injecting one of the reaction materials into said reaction space of said reaction device.

9. The clustered reaction system as claimed in claim 1, wherein:
    each of said reaction devices further includes a support platform and a lift frame located below said support platform;
    said reaction tank unit of each of said reaction devices includes
        a reaction tank body that defines said reaction space and that has an opening,
        a cover that is connected to said support platform and that is formed with said through holes, and two support blocks that are respectively connected to two opposite sides of said reaction tank body and that are supported by said lift frame; and said lift frame of each of said reaction devices is operable to lift said support blocks of said reaction tank unit of said reaction device to bring said reaction tank body to come into contact with said cover to cover said opening, and is operable to lower said support blocks to bring said reaction tank body away from said cover to uncover said opening.

10. The clustered reaction system as claimed in claim 9, wherein said cover of said reaction tank body of each of said reaction devices includes a sealing portion that covers said opening when said reaction tank body is in contact with said cover, and a support portion that surrounds said sealing portion and that is supported by said support platform.

11. The clustered reaction system as claimed in claim 1, further comprising a real-time control device that is in signal communication with said reaction devices, said cooling device, said gas supply device and said temperature monitor device for monitoring parameters of and being operable to control said reaction devices, said cooling device, said gas supply device and said temperature monitor device.

\* \* \* \* \*